United States Patent
Nakayama et al.

(10) Patent No.: US 10,333,024 B2
(45) Date of Patent: Jun. 25, 2019

(54) GROUND FAULT DETECTION FOR LIGHT-EMITTING ELEMENT DRIVE DEVICE

(71) Applicant: Rohm Co., Ltd., Kyoto (JP)

(72) Inventors: Masaaki Nakayama, Kyoto (JP); Tomoya Saito, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/755,430

(22) PCT Filed: Jul. 20, 2016

(86) PCT No.: PCT/JP2016/071275
§ 371 (c)(1),
(2) Date: Feb. 26, 2018

(87) PCT Pub. No.: WO2017/033629
PCT Pub. Date: Mar. 2, 2017

(65) Prior Publication Data
US 2018/0254379 A1   Sep. 6, 2018

(30) Foreign Application Priority Data
Aug. 27, 2015 (JP) ................. 2015-168092

(51) Int. Cl.
*B60Q 1/04* (2006.01)
*H02H 1/00* (2006.01)
(Continued)

(52) U.S. Cl.
CPC ............ *H01L 33/02* (2013.01); *B60Q 1/0408* (2013.01); *H01L 33/00* (2013.01); *H02H 1/003* (2013.01);
(Continued)

(58) Field of Classification Search
CPC ....... H01L 33/02; H01L 33/00; B60Q 1/0408; H02H 1/003; H05B 33/0884; H05B 37/02
See application file for complete search history.

(56) References Cited

U.S. PATENT DOCUMENTS 7,218,086 B1 *   5/2007   Ritter ................. H05B 33/0815
                                                              323/284
2010/0007999 A1 *   1/2010   Iwata ..................... H02M 3/158
                                                              361/18
(Continued)

FOREIGN PATENT DOCUMENTS

CN       202799274 U    3/2013
CN       104006368 A    8/2014
(Continued)

OTHER PUBLICATIONS

Japan Patent Office, International Search Report for PCT/JP2016/071275 dated Oct. 18, 2016 with English translation.
(Continued)

Primary Examiner — Dedei K Hammond
Assistant Examiner — Raymond R Chai
(74) Attorney, Agent, or Firm — Fish & Richardson P.C.

(57) ABSTRACT

Provided is a light-emitting element drive device including a transistor control unit arranged to drive and control a transistor connected to a light-emitting element, an output ground fault detection unit arranged to output an output ground fault detection signal corresponding to the voltage level at a connection node between the light-emitting element and the transistor, a stop control unit arranged to stop driving the transistor when the output ground fault detection signal indicates an output ground fault, and a mask signal generation unit arranged to generate a mask signal that masks the output ground fault detection signal on device startup.

4 Claims, 8 Drawing Sheets

(51) Int. Cl.
H01L 33/00 (2010.01)
H01L 33/02 (2010.01)
H05B 33/08 (2006.01)
H05B 37/02 (2006.01)

(52) U.S. Cl.
CPC ..... *H05B 33/0806* (2013.01); *H05B 33/0884* (2013.01); *H05B 37/02* (2013.01); *Y02B 20/341* (2013.01)

(56) References Cited

U.S. PATENT DOCUMENTS

| | | |
|---|---|---|
| 2011/0169496 A1 | 7/2011 | Fried |
| 2013/0015781 A1 | 1/2013 | Kanemitsu et al. |
| 2014/0241001 A1 | 8/2014 | Yoshikawa et al. |
| 2015/0029628 A1 | 1/2015 | Ohtake |
| 2015/0116635 A1 | 4/2015 | Kanemitsu et al. |
| 2016/0143098 A1 | 5/2016 | Nishitani |
| 2016/0227616 A1* | 8/2016 | Lee .................. H05B 33/0815 |

FOREIGN PATENT DOCUMENTS

| | | |
|---|---|---|
| JP | 2009-255679 A | 11/2009 |
| JP | 2014-207336 A | 10/2014 |
| JP | 2015-027226 A | 2/2015 |

OTHER PUBLICATIONS

European Patent Office; Extended European Search Report mailed in counterpart European patent application No. 16838976.5 dated (Jan. 11, 2019).

\* cited by examiner

GROUND FAULT DETECTION FOR LIGHT-EMITTING ELEMENT DRIVE DEVICE

TECHNICAL FIELD

The present invention relates to a light-emitting element drive device.

BACKGROUND ART

Conventionally, various light-emitting element drive devices that drive light-emitting elements such as light-emitting diodes (LEDs) are developed.

As an example of the conventional light-emitting element drive device, there is a device that drives a transistor such as a PNP transistor connected in series to the LED and supplies a constant current to the LED so as to drive the LED. Further, some of these light-emitting element drive devices have an output ground fault protection function for preventing thermal breakdown of the transistor when the anode of the LED (a connection portion to the transistor) is short-circuited to the ground (when an output ground fault occurs).

As to this output ground fault protection function, an output ground fault protection unit detects that an output voltage as an anode voltage of the LED becomes low voltage due to occurrence of the output ground fault, and a controller turns off the transistor based on a detection signal thereof so as to prevent thermal breakdown of the transistor.

Note that as an example of a conventional technique related to the above description, there is Patent Document 1.

LIST OF CITATIONS

Patent Literature

Patent Document 1: JP-A-2009-255679

SUMMARY OF THE INVENTION

Technical Problem

However, the conventional light-emitting element drive device described above has the following problem. When power is turned on to start a light emission device including the light-emitting element drive device and the LED, because the output voltage (anode voltage of the LED) is 0 V, the output ground fault protection unit may misdetect that an output ground fault has occurred, and this misdetection may cause a malfunction such as, for example, an output of a flag signal indicating abnormality to the outside from the controller.

In view of the above circumstance, it is an object of the present invention to provide a light-emitting element drive device that can eliminate malfunction on device startup due to the output ground fault protection function.

Means for Solving the Problem

A light emission drive device according to the present invention includes a transistor control unit arranged to drive and control a transistor connected to a light-emitting element, an output ground fault detection unit arranged to output an output ground fault detection signal corresponding to a voltage level at a connection node between the light-emitting element and the transistor, a stop control unit arranged to stop driving of the transistor when the output ground fault detection signal indicates an output ground fault, and a mask signal generation unit arranged to generate a mask signal that masks the output ground fault detection signal on device startup (first structure).

In addition, in the first structure described above, it is possible to adopt a structure in which an abnormal state output unit arranged to output an abnormality flag signal indicating an abnormal state when the output ground fault detection signal indicates an output ground fault is further provided, and the abnormal state output unit outputs the abnormality flag signal indicating a normal state during a period in which the output ground fault detection signal is masked by the mask signal (second structure).

In addition, in the second structure described above, it is possible to adopt a structure in which a reference voltage generation unit arranged to generate a reference voltage from a power supply voltage is further provided, operation of the output ground fault detection unit starts when the reference voltage rises to reach a predetermined UVLO release voltage on device startup, and the mask signal generation unit generates the mask signal that rises to a masking level responding to rising of the reference voltage on device startup (third structure).

In addition, in the first structure described above, it is possible to adopt a structure in which a drive signal output unit arranged to output a pulse-like drive signal to the transistor control unit responding to an input PWM signal so as to control ON/OFF of drive of the transistor control unit, and a capacitor connected to a connection node between the transistor and the light-emitting element are further provided, the stop control unit includes the drive signal output unit and the transistor control unit, the drive signal output unit outputs to the transistor control unit the drive signal that turns off the drive regardless of the PWM signal when the output ground fault detection signal indicates an output ground fault, and the drive signal output unit outputs to the transistor control unit the drive signal that turns on the drive in at least a part of period during which the output ground fault detection signal is masked by the mask signal starting from timing of starting to generate the PWM signal (fourth structure).

In addition, in the fourth structure described above, it is possible to adopt a structure in which the drive signal output unit outputs to the transistor control unit the drive signal that turns on the drive in the whole period during which the output ground fault detection signal is masked by the mask signal starting from timing of starting to generate the PWM signal (fifth structure).

In addition, in the fourth or fifth structure described above, it is possible to adopt a structure in which the mask signal generation unit generates the mask signal that maintains a masking level during a predetermined period by a trigger when starting generation of the PWM signal (sixth structure).

In addition, in the sixth structure described above, it is possible to adopt a structure in which the PWM signal is generated in the outside of the light-emitting element drive device and is input (seventh structure).

In addition, an LED light emission device according to another aspect of the present invention includes an LED as a light-emitting element, and the light-emitting element drive device having any one of the first to seventh structures described above, which supplies an output voltage to the LED (eighth structure).

In addition, the LED light emission device according to the eighth structure described above may be provided as an LED headlight module, an LED turn lamp module, or an LED rear lamp module (ninth structure).

In addition, a vehicle according to another aspect of the present invention includes the LED light emission device having the eighth or ninth structure.

Advantageous Effects of the Invention

According to the present invention, it is possible to eliminate malfunction on device startup due to the output ground fault protection function.

DESCRIPTION OF EMBODIMENTS

Hereinafter, one embodiment of the present invention is described with reference to the drawings. For understanding of the embodiment of the present invention, it is described based on comparison with a comparative example below.

Figure 1:
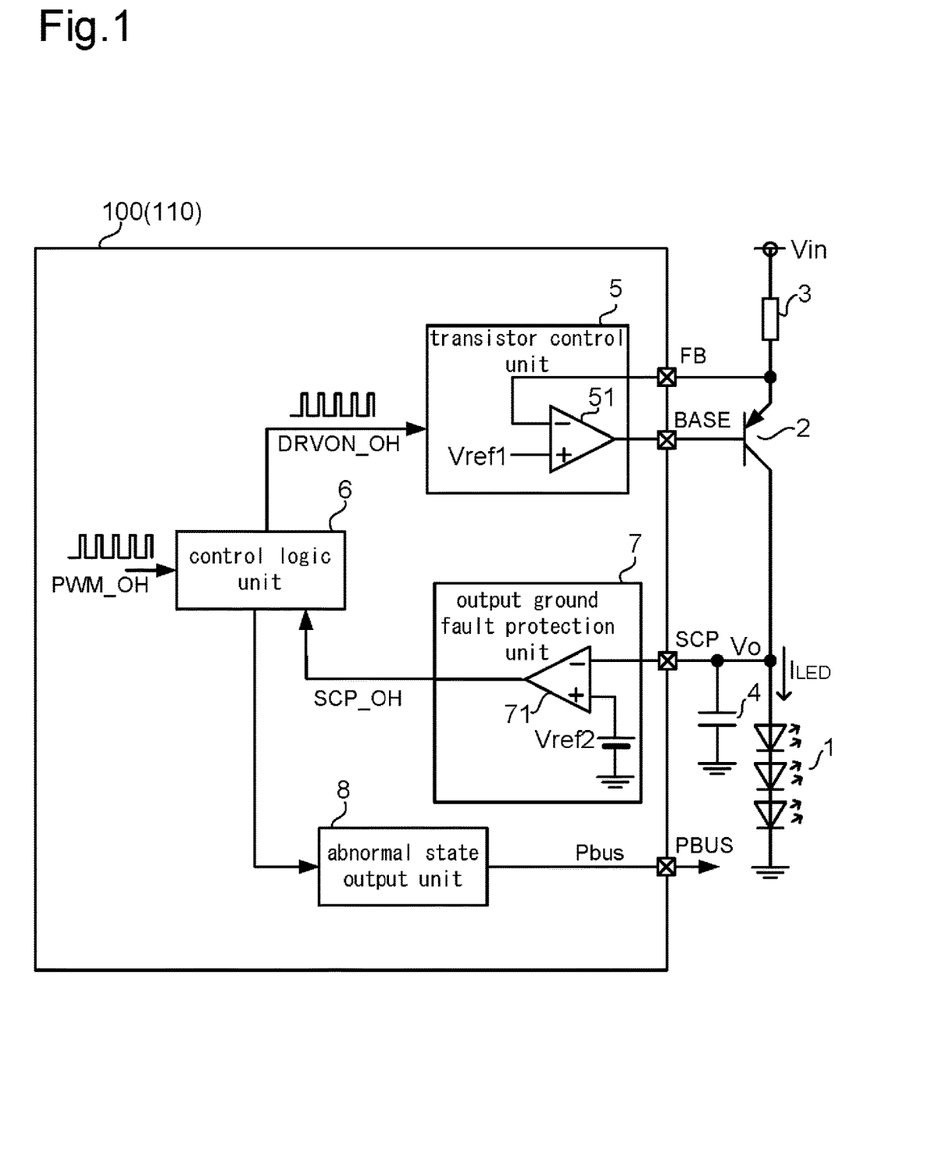
FIG. 1 is a diagram showing a structure of a light emission device including an LED driver IC according to one embodiment of the present invention and a comparative example thereof.

FIG. 1 shows a structure of a light emission device including an LED driver IC (one example of a light-emitting element drive device) according to one embodiment of the present invention. Note that a structure of an LED driver IC 100 according to this embodiment shown in FIG. 1 shows only a main part and is the same as a structure of an LED driver IC 110 according to a comparative example (details will be described later).

The LED driver IC 100 shown in FIG. 1 is a semiconductor integrated circuit device in which a transistor control unit 5, a control logic unit 6, an output ground fault protection unit 7, and an abnormal state output unit 8 are integrated. In addition, the LED driver IC 100 has a plurality of external terminals for establishing electric connection with the outside (FIG. 1 clearly shows only the external terminals FB, BASE, SCP, and PBUS as representatives).

In addition, the light emission device shown in FIG. 1 including the LED driver IC 100 is equipped with an LED 1, a PNP transistor 2, a resistor 3, and a capacitor 4, which are disposed in the outside of the LED driver IC 100.

The LED 1 is constituted of a plurality of LED elements connected in series and emits light when current is supplied. Note that the LED 1 is not limited to this structure but may be constituted of a plurality of LED elements connected in series and parallel or may be constituted of a single LED element.

One terminal of the resistor 3 for current detection is applied with a power supply voltage Vin, and the other terminal is connected to the emitter of the PNP transistor 2. The collector of the PNP transistor 2 is connected to the anode of the LED 1. The cathode of the LED 1 is connected to an application terminal of a ground potential.

The transistor control unit 5 includes an error amplifier 51. An inverting terminal of the error amplifier 51 is connected to the connection node between the resistor 3 and the PNP transistor 2 via the external terminal FB. A noninverting terminal of the error amplifier 51 is applied with a predetermined reference voltage Vref1. In addition, the output terminal of the error amplifier 51 is connected to the base of the PNP transistor 2 via the external terminal BASE.

The external terminal FB is applied with a feedback voltage obtained by current-to-voltage conversion of the current flowing in a resistor R3. Further, the transistor control unit 5 drives the PNP transistor 2 by the output signal of the error amplifier 51 to which the feedback voltage and the reference voltage Vref1 are input, and hence controls the LED current $I_{LED}$ flowing in the LED 1 to be constant. In other words, constant current control of the LED current is performed.

In addition, the control logic unit 6 is supplied with a pulse width modulation (PWM) signal PWM_OH. The control logic unit 6 generates a pulse-like drive signal DRVON_OH according to the supplied PWM signal and outputs the same to the transistor control unit 5. The driving of the transistor control unit 5 is turned on and off according to the input drive signal DRVON_OH, and the LED current $I_{LED}$ is turned on and off according thereto. Therefore, an on-duty ratio of the PWM signal PWM_OH is adjusted so that dimming of the LED 1 can be performed.

In addition, the output ground fault protection unit 7 includes a comparator 71. An inverting terminal of the comparator 71 is connected to a connection node between the PNP transistor 2 and the LED 1 via the external terminal SCP. Note that the external terminal SCP is connected to one terminal of the capacitor 4, and the other terminal of the capacitor 4 is connected to an application terminal of the ground potential. The capacitor 4 is provided for the purpose of protecting the LED 1 from electro static discharge (ESD) breakdown or countermeasure against electro-magnetic compatibility (EMC) test.

In addition, a noninverting terminal of the comparator 71 is applied with a predetermined reference voltage Vref2. An output ground fault detection signal SCP_OH that is an output signal of the comparator 71 is output to the control logic unit 6.

When an output voltage Vo as an anode voltage of the LED 1 is normal, the output voltage Vo becomes higher than the reference voltage Vref2, and the output ground fault detection signal SCP_OH becomes low level. However, when the anode of the LED 1 (collector of the PNP transistor 2) is short-circuited to the ground so that an output ground fault occurs, the output voltage Vo becomes low voltage and is lower than the reference voltage Vref2, and hence the output ground fault detection signal SCP_OH becomes high level. Note that the output ground fault is equivalent to the state where the anode and the cathode of the LED 1 are wired to each other in FIG. 1.

When the control logic unit 6 detects that the output ground fault detection signal SCP_OH is changed to high level, it maintains the drive signal DRVON_OH at low level regardless of the PWM signal PWM_OH. In this way, the driving of the transistor control unit 5 is turned off so that the PNP transistor 2 is turned off, and hence thermal breakdown of the PNP transistor 2 can be prevented.

In addition, when the control logic unit 6 detects that the output ground fault detection signal SCP_OH is changed to high level, the abnormal state output unit 8 outputs an abnormality flag signal Pbus indicating an abnormal state to the outside via the external terminal PBUS based on an instruction from the control logic unit 6. In this way, it is possible to inform the outside about the abnormality. Note that in a normal state the abnormal state output unit 8 outputs the abnormality flag signal Pbus indicating normal to the outside.

Figure 4:
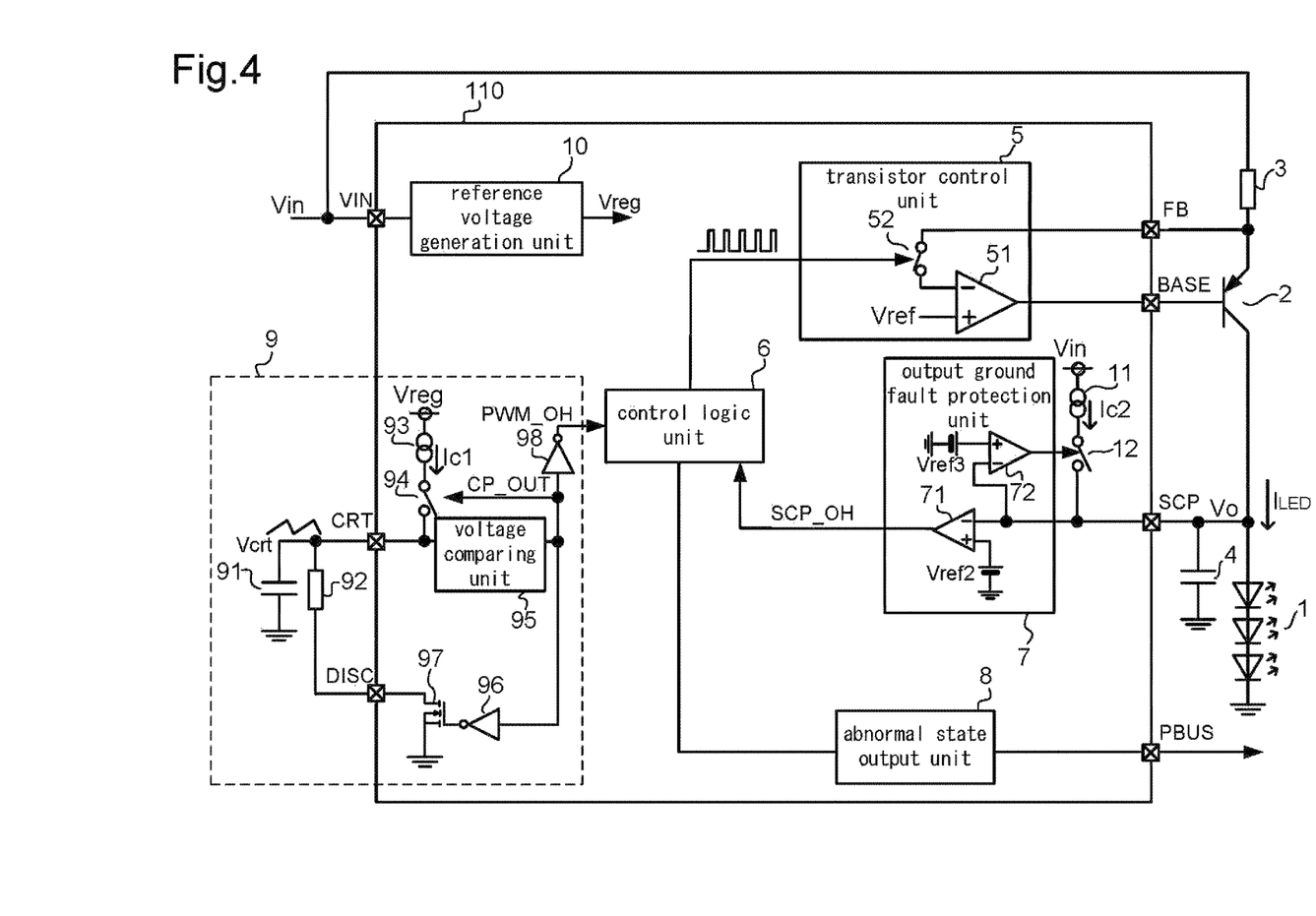
FIG. 4 is a diagram showing a structure of the light emission device including the LED driver IC according to a comparative example.

Next, FIG. 4 shows a more detailed structure of the LED driver IC 110 according to a comparative example of the embodiment of the present invention. As shown in FIG. 4, the LED driver IC 110 includes a reference voltage generation unit 10. The power supply voltage Vin is applied to the one terminal of the resistor 3 and to the reference voltage generation unit 10 via an external terminal VIN. The reference voltage generation unit 10 generates a reference voltage Vreg (e.g. 5 V) from the input power supply voltage Vin. This reference voltage Vreg is used as a power supply voltage for an internal circuit of the LED driver IC 110.

In addition, as shown in FIG. 4, a PWM signal generation unit 9 that generates the PWM signal PWM_OH is constituted of a capacitor 91 and a resistor 92 that are external components, and an internal structure of the LED driver IC 110. The LED driver IC 110 includes a constant current source 93, a switch 94, a voltage comparing unit 95, an inverter 96, a MOS transistor 97, and an inverter 98, as the internal structure described above.

One terminal of the capacitor 91 and one terminal of the resistor 92 are commonly connected to an external terminal CRT. The other terminal of the capacitor 91 is connected to an application terminal of the ground potential. The constant current source 93 and the switch 94 are connected in series between an application terminal of the reference voltage Vreg and a connection node between the external terminal CRT and the voltage comparing unit 95.

The voltage comparing unit 95 compares a voltage Vcrt applied at the external terminal CRT with a predetermined voltage threshold value and outputs a result of the comparison as a comparison detection signal CP_OUT constituted of high level and low level. The comparison detection signal CP_OUT is input to the inverter 98 and the inverter 96. In addition, ON/OFF of the switch 94 is switched according to a level of the comparison detection signal CP_OUT.

The output signal of the inverter 98 becomes the PWM signal PWM_OH. In addition, the output signal of the inverter 96 is applied to the gate of the MOS transistor 97 that is an N-channel MOSFET. The drain of the MOS transistor 97 is connected to the other terminal of the resistor 92 via an external terminal DISC, and the source thereof is connected to an application terminal of the ground potential.

Operation of the PWM signal generation unit 9 having the structure described above is described with reference to the timing chart shown in FIG. 6, too. The switch 94 is in on-state, and a constant current Ic1 generated by the constant current source 93 charges the capacitor 91. The voltage Vcrt generated at the external terminal CRT (in the upper part of FIG. 6) is increased along with the charging, and the voltage comparing unit 95 outputs the comparison detection signal CP_OUT having high level until the voltage Vcrt reaches a threshold value voltage Vcrt_dist. In this way, the switch 94 is turned on, the MOS transistor 97 is turned off by the output of the inverter 96, and the inverter 98 outputs the PWM signal PWM_OH having low level (in the middle part of FIG. 6).

Further, when the voltage Vcrt reaches the voltage threshold value Vcrt_dist, the voltage comparing unit 95 sets the comparison detection signal CP_OUT to low level. In this way, the switch 94 is turned off, and the MOS transistor 97 is turned on by the output of the inverter 96. Therefore, the charging of the capacitor 91 is stopped, and discharge of the capacitor 91 is started by the MOS transistor 97 via the resistor 92.

The voltage Vcrt is decreased along with the discharging of the capacitor 91, and the voltage comparing unit 95 sets the comparison detection signal CP_OUT to low level until the voltage Vcrt reaches a voltage threshold value Vcrt_cha (<Vcrt_dist). Therefore, the PWM signal PWM_OH as the output of the inverter 98 becomes high level.

Further, when the voltage Vcrt reaches the voltage threshold value Vcrt_cha, the voltage comparing unit 95 sets the comparison detection signal CP_OUT to high level. In this way, the switch 94 is turned on, the MOS transistor 97 is turned off, and the discharging of the capacitor 91 is stopped while the charging thereof is started.

By this operation, the PWM signal PWM_OH is generated. The period and the on-duty ratio of the PWM signal PWM_OH can be set by the capacitor 91 and the resistor 92, which are external components.

Figure 6:
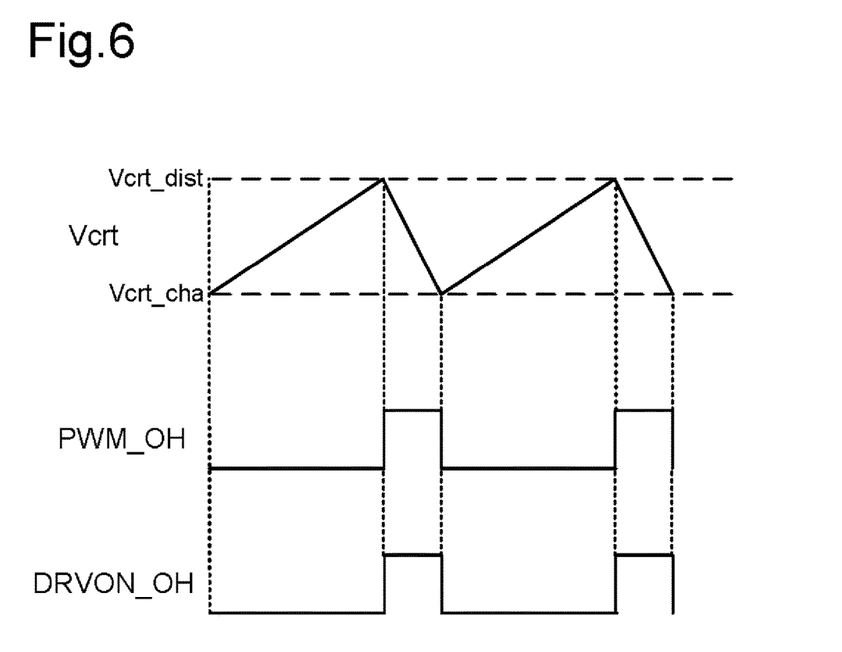
FIG. 6 is a timing chart showing waveforms of a voltage applied to an external terminal CRT, a PWM signal, and a drive signal.

Further, as shown in the lower part of FIG. 6, the control logic unit 6 outputs high level as the drive signal DRVON_OH during the period in which the input PWM signal PWM_OH is at high level, while it outputs low level as the drive signal DRVON_OH during the period in which the PWM signal PWM_OH is at low level. When the drive signal DRVON_OH is at high level, a switch 52 disposed between the external terminal FB and the inverting terminal of the error amplifier 51 in the transistor control unit 5 is turned on. In this way, the driving of the transistor control unit 5 is turned on so that the PNP transistor 2 is driven, and the current $I_{LED}$ as constant current flows in the LED 1.

On the other hand, when the drive signal DRVON_OH is at low level, the switch 52 is turned off. In this way, the driving of the transistor control unit 5 is turned off so that the PNP transistor 2 is turned off, and hence the current $I_{LED}$ does not flow. Therefore, brightness due to light emission of the LED 1 can be adjusted according to the on-duty ratio of the PWM signal PWM_OH.

In addition, the output ground fault protection unit 7 includes a comparator 72 in addition to the comparator 71. An inverting terminal of the comparator 72 is connected to the external terminal SCP, and a noninverting terminal is applied with a predetermined reference voltage Vref3. For example, when the reference voltage Vref2 for the comparator 71 is 1.2 V, the reference voltage Vref3 is set to e.g. 1.3 V. In addition, a constant current source 11 and a switch 12 are connected in series between an application terminal of the power supply voltage Vin and the external terminal SCP. ON/OFF of the switch 12 is switched according to an output of the comparator 72.

With this structure, when the output voltage Vo is decreased to be lower than the reference voltage Vref3, the output of the comparator 72 becomes high level so that the switch 12 is turned on, and hence the capacitor 4 is charged by a constant current Ic2 generated by the constant current source 11. In this way, the output voltage Vo is increased, and when the output voltage Vo becomes the reference voltage Vref3 or higher, the switch 12 is turned off so that the charging of the capacitor 4 is stopped. In this way, when the output voltage Vo is decreased to be lower than the reference voltage Vref2 so that the output ground fault detection signal SCP_OH becomes high level, and thus misoperation of the output ground fault protection function can be prevented.

Next, the startup operation of the light emission device including the LED driver IC 110 according to the comparative example is described with reference to a timing chart shown in FIG. 5, too.

Figure 5:
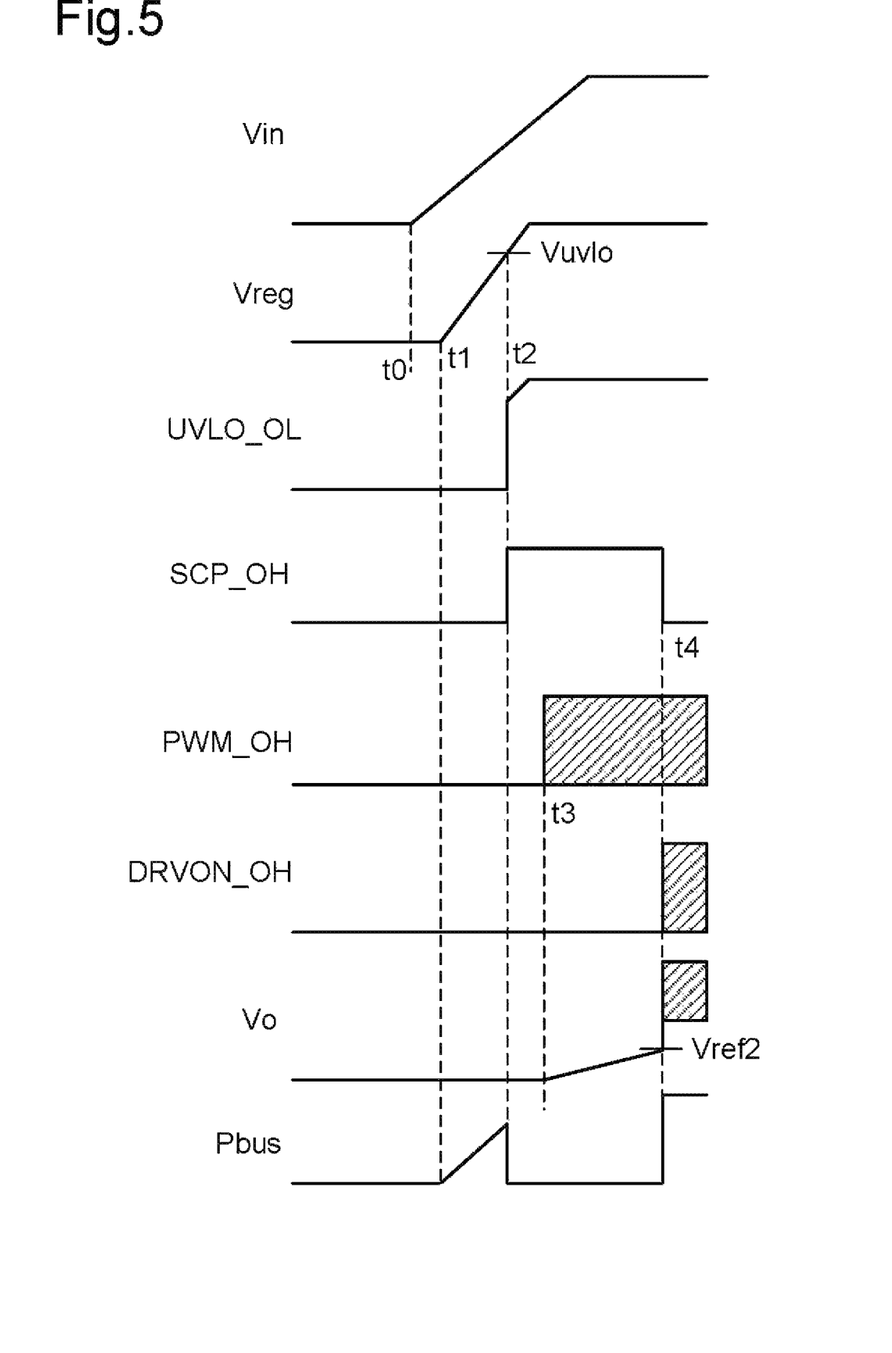
FIG. 5 is a timing chart indicating a startup operation of the light emission device including the LED driver IC according to the comparative example.

As shown in FIG. 5, when the power supply is turned on, the power supply voltage Vin rises at timing t0. Further, the reference voltage Vreg generated by the reference voltage generation unit 10 rises at timing t1 after timing t0. Responding to the rising of the reference voltage Vreg, the abnormality flag signal Pbus output from the abnormal state output unit 8 also rises.

The reference voltage generation unit 10 has an under voltage lock out (UVLO) function (a low voltage misoperation prevention function), and the internal circuit of the LED driver IC 110 is made to be a standby state until the reference voltage Vreg reaches a predetermined UVLO release voltage. Further, when the reference voltage Vreg reaches the UVLO release voltage (e.g. 4 V), the reference voltage generation unit 10 allows the internal circuit described above to operate.

In FIG. 5, when the reference voltage Vreg reaches the UVLO release voltage Vuvlo at timing t2, the UVLO_OL becomes high level. Then, the output ground fault protection unit 7 operates, and because the output voltage Vo is 0 V at this time point, the output ground fault detection signal SCP_OH as an output of the comparator 71 becomes high level. Then, on the basis of the output ground fault detection signal SCP_OH, the control logic unit 6 instructs the abnormal state output unit 8 to set the abnormality flag signal Pbus to low level indicating an abnormal state.

After that, the PWM signal generation unit 9 starts generation of the PWM signal PWM_OH at timing t3 (hatching in FIG. 5 indicates a waveform repeating high level and low level). However, because the output ground fault detection signal SCP_OH is at high level, the control logic unit 6 maintains the drive signal DRVON_OH at low level regardless of the input PWM signal PWM_OH. Therefore, the switch 52 is turned off, and the PNP transistor 2 is turned off.

On the other hand, the output of the comparator 72 starts at timing t3, and the switch 12 is turned on. Then, the charging of the capacitor 4 is started by the constant current Ic2 from the constant current source 11. This charging gradually increases the output voltage Vo. Further, at timing t4 when the output voltage Vo reaches the reference voltage Vref2, the output ground fault detection signal SCP_OH becomes low level. In this way, the control logic unit 6 instructs the abnormal state output unit 8 to set the abnormality flag signal Pbus to high level indicating the normal state.

In addition, because the output ground fault detection signal SCP_OH becomes low level, the control logic unit 6 starts output of the pulse-like drive signal DRVON_OH according to the PWM signal PWM_OH. In this way, the light emission of the LED 1 is started. In this case, the output voltage Vo has a waveform repeating a forward voltage higher than the reference voltage Vref2 and a voltage higher than the forward voltage.

The startup operation of the LED driver IC 110 according to the comparative example described above has the following problem. Because it starts from the output voltage Vo of 0 V, misdetection of the output ground fault (high level of the output ground fault detection signal SCP_OH) causes output of the abnormality flag signal Pbus indicating abnormality, although no abnormal state has occurred.

In addition, because of misdetection of the output ground fault, the control logic unit 6 sets the drive signal DRVON_OH to low level regardless of the PWM signal PWM_OH. Then, the capacitor 4 is charged by very small constant current Ic2 (e.g. 1 mA), and increasing speed of the output voltage Vo is small. Thus, a time period until the output voltage Vo reaches the reference voltage Vref2 (period from t3 to t4) is increased. As a result, there is also a problem that the startup time of the LED 1 until starting light emission (period from t0 to t4) is increased.

Figure 2:
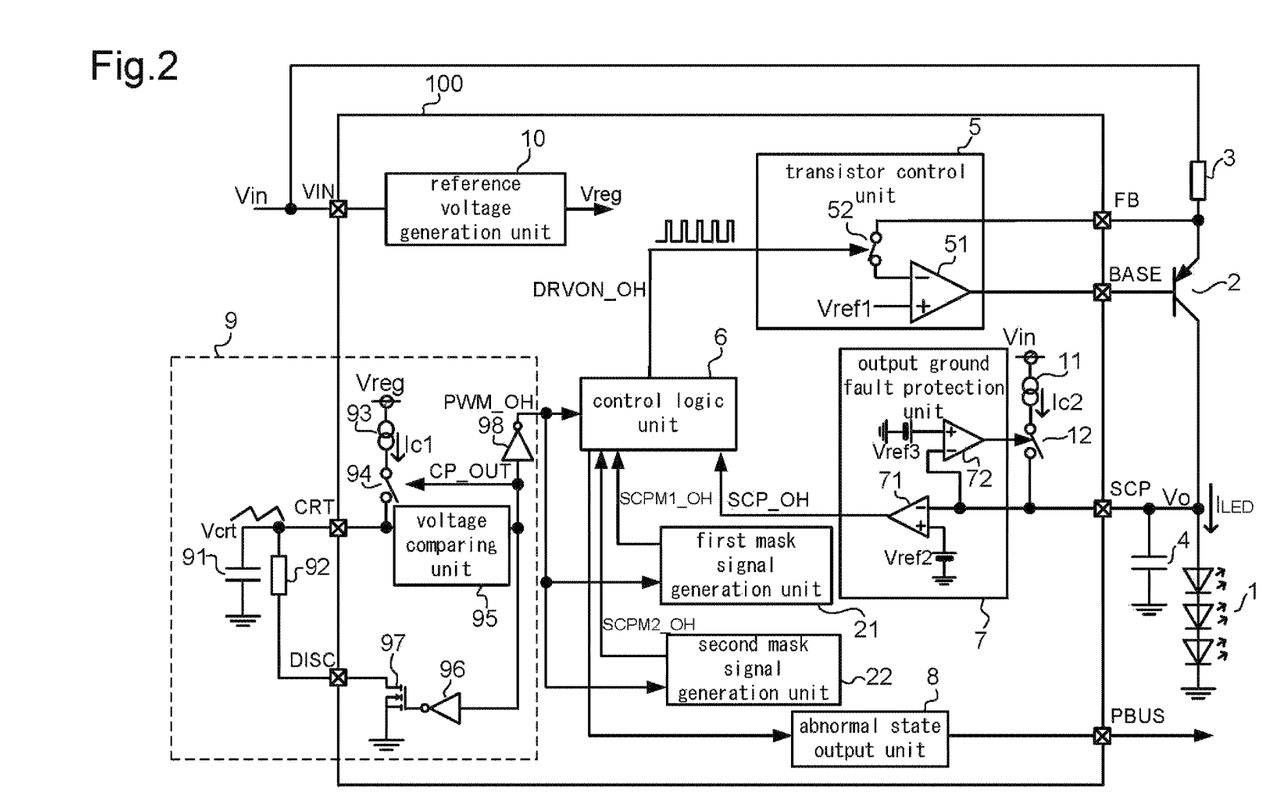
FIG. 2 is a diagram showing a structure of the light emission device including the LED driver IC according to one embodiment of the present invention.

Therefore, the LED driver IC 100 according to the embodiment of the present invention is configured as shown in FIG. 2. The LED driver IC 100 shown in FIG. 2 has a structure in which a first mask signal generation unit 21 and a second mask signal generation unit 22 are further provided in the structure of the LED driver IC 110 according to the comparative example (FIG. 4).

A startup operation of the light emission device including the LED driver IC 100 having the structure described above is described with reference to a timing chart shown in FIG. 3, too.

When the power supply voltage Vin rises at timing t10 and the reference voltage Vreg rises at timing t11 after timing t10, a first mask signal SCPM1_OH generated by the first mask signal generation unit 21 and the abnormality flag signal Pbus rise responding to the reference voltage Vreg.

Further, at timing t12 when the reference voltage Vreg reaches the UVLO release voltage Vuvlo, the operation of the output ground fault protection unit 7 is started. Because the output voltage Vo is 0 V, the output ground fault detection signal SCP_OH as the output of the comparator 71 becomes high level.

Although the output ground fault detection signal SCP_OH is at high level, because the first mask signal SCPM1_OH has been raised, the control logic unit 6 instructs the abnormal state output unit 8 so that the abnormality flag signal Pbus continues to rise. Further, the first mask signal SCPM1_OH reaches a predetermined high level. Although the output ground fault detection signal SCP_OH is at high level, because the first mask signal SCPM1_OH is at high level (indicating a masking state), the control logic unit 6 instructs the abnormal state output unit 8 to set the abnormality flag signal Pbus to high level indicating the normal state.

Further, when the generation of the PWM signal PWM_OH is started at timing t13, this is used as a trigger by the first mask signal generation unit 21 to set the first mask signal SCPM1_OH to high level for a predetermined period T1 (e.g. 80 μsec) from timing t13. After the predetermined period T1 elapses, the first mask signal SCPM1_OH is set to low level.

In addition, the start of generation of the PWM signal PWM_OH is used as a trigger by the second mask signal generation unit 22 to switch a second mask signal SCPM2_OH from low level to high level, and to maintain the high level for the predetermined period T1. After the predetermined period T1 elapses, the second mask signal SCPM2_OH is set to low level. Although the output ground fault detection signal SCP_OH is at high level, because the second mask signal SCPM2_OH is at high level (indicating the masking state), the control logic unit 6 maintains the drive signal DRVON_OH at high level regardless of the PWM signal PWM_OH.

In this way, on-state of the driving of the transistor control unit 5 is maintained, current flowing in the turned-on PNP transistor 2 charges the capacitor 4. In this way, the output voltage Vo is increased to reach the reference voltage Vref2 at timing t14. Then, the output ground fault detection signal SCP_OH becomes low level, and hence the control logic unit 6 starts to output the pulse-like drive signal DRVON_OH corresponding to the PWM signal PWM_OH (hatching in FIG. 3). In this way, light emission of the LED 1 is started. In this case, the output voltage Vo has a waveform repeating the forward voltage higher than the reference voltage Vref2 and a voltage higher than the forward voltage.

In addition, at timing t14 and after, because the output ground fault detection signal SCP_OH is at low level, the control logic unit 6 instructs the abnormal state output unit 8 to output the abnormality flag signal Pbus at high level indicating the normal state.

According to this LED driver IC 100 according to the embodiment of the present invention, in the startup operation, even if the output ground fault detection signal SCP_OH becomes high level so that output ground fault is misdetected, the first mask signal SCPM1_OH at high level masks the output ground fault detection signal SCPM1_OH, and hence the abnormality flag signal Pbus can be output to indicate the normal state though it is originally to indicate an abnormal state.

In addition, even if the output ground fault detection signal SCP_OH becomes high level so that output ground fault is misdetected, the second mask signal SCPM2_OH at high level masks the output ground fault detection signal SCP_OH, and hence the drive signal DRVON_OH is maintained at high level though it is originally to be low level regardless of the PWM signal PWM_OH. In this way, current flowing in the PNP transistor 2 charges the capacitor 4, and hence increasing speed of the output voltage Vo can be increased. Thus, a time period until the output voltage Vo reaches the reference voltage Vref2 (period from timing t13 to timing t14) can be shortened. As a result, the startup time until the LED 1 starts to emit light (period from timing t10 to timing t14) can be shortened.

<Variations>

Figure 3:
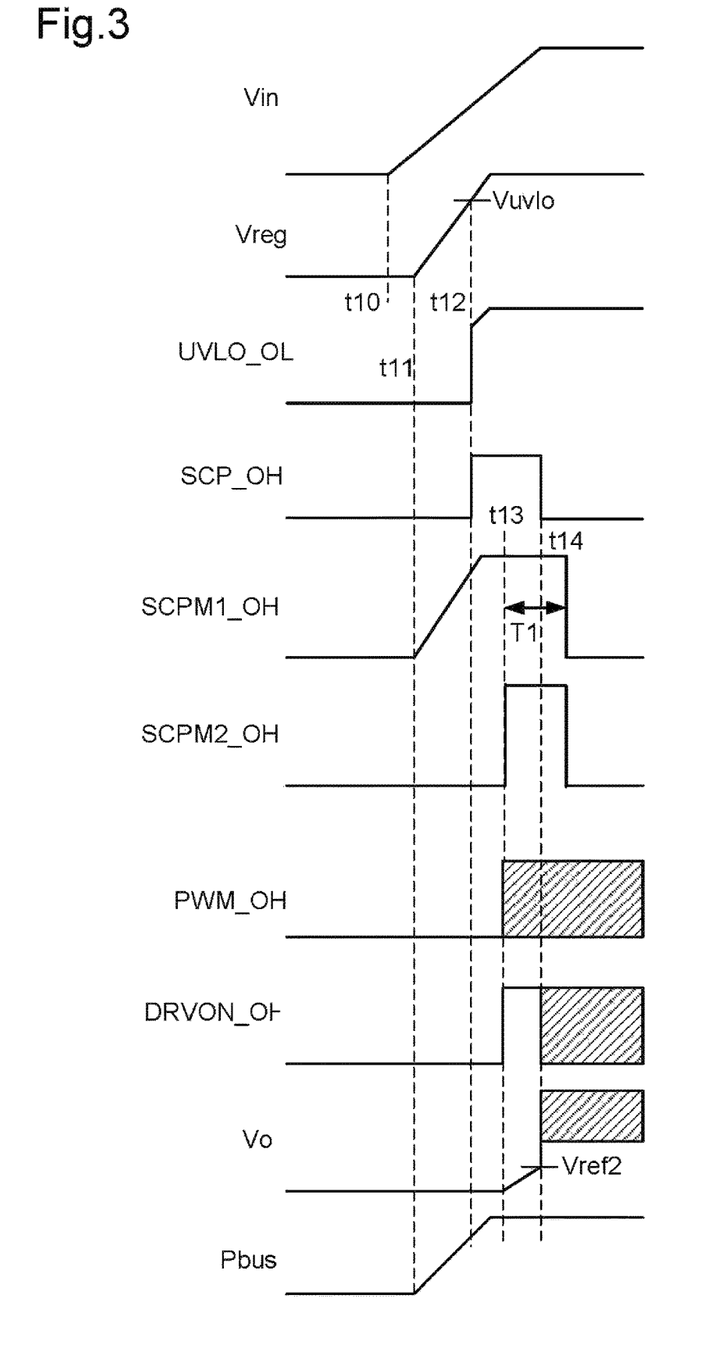
FIG. 3 is a timing chart showing a startup operation of the light emission device including the LED driver IC according to one embodiment of the present invention.

In the embodiment described above, for example, it is possible to adopt a structure in which the first and second mask signal generation units are commonized, and by a trigger when the reference voltage Vreg reaches the UVLO release voltage, the mask signal is generated, which is maintained at high level for a predetermined period from the timing (timing t12 in FIG. 3).

However, particularly in the embodiment described above, it is possible to adopt a structure in which the PWM signal is generated in the outside of the LED driver IC 100, and the control logic unit 6 receives the PWM signal from the outside. In this case, the timing when the generation of the PWM signal is started is unknown. Therefore, in the variation described above, the mask signal may be changed from high level to low level during the period while the output ground fault detection signal SCP_OH is becoming high level, and afterward the generation of the PWM signal may be started.

In this case, the output ground fault detection signal SCP_OH at high level is not masked, and the abnormality flag signal Pbus at low level indicating abnormality is output. In addition, because the output ground fault detection signal SCP_OH at high level at timing when the generation of the PWM signal is started is not masked, the drive signal DRVON_OH is maintained at low level regardless of the PWM signal, and the charging of the capacitor 4 is started by the very small constant current Ic2 when the switch 12 is turned on. Therefore, the increasing speed of the output voltage Vo is decreased, and the startup time until the LED 1 is turned on is increased.

Therefore, like the first mask signal SCPM1_OH and the second mask signal SCPM2_OH in the embodiment described above, by maintaining high level for a predetermined period by a trigger when the generation of the PWM signal PWM_OH is started, the above-mentioned event can be avoided without depending on the generation start timing of the PWM signal.

In addition, the drive signal DRVON_OH may repeat high level and low level in the period of masking the output ground fault detection signal SCP_OH at high level (from timing t13 to timing t14 in FIG. 3). However, like the embodiment described above, it is preferred in the above-mentioned period to maintain the drive signal DRVON_OH at high level because the increasing speed of the output voltage Vo is increased.

In addition, the PNP transistor 2 may be replaced with a P-channel MOSFET, and the P-channel MOSFET may be integrated inside the LED driver IC.

<Vehicle, LED Lamp Module>

Figure 7:
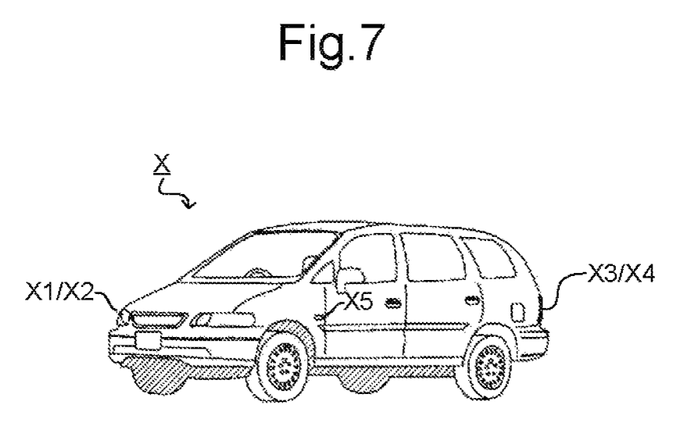
FIG. 7 is an external view (front) of a vehicle in which the LED driver IC according to one embodiment of the present invention is mounted.
Figure 8:
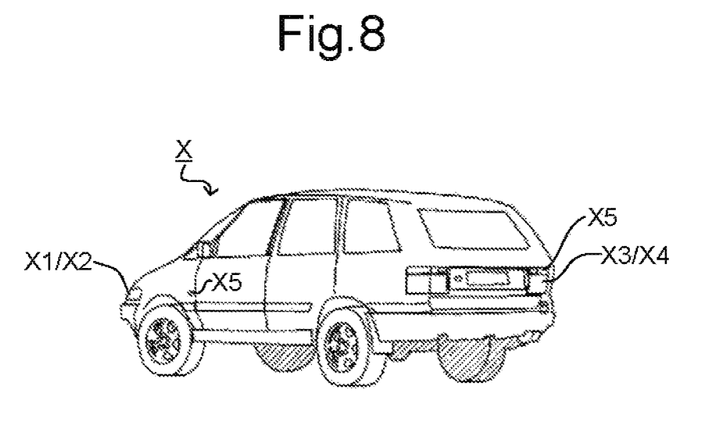
FIG. 8 is an external view (rear) of the vehicle in which the LED driver IC according to one embodiment of the present invention is mounted.
Figure 9:
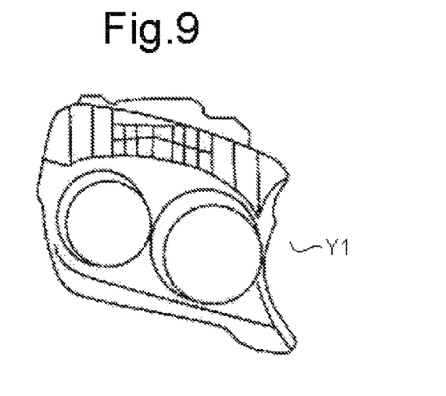
FIG. 9 is an external view of an LED headlight module.
Figure 10:
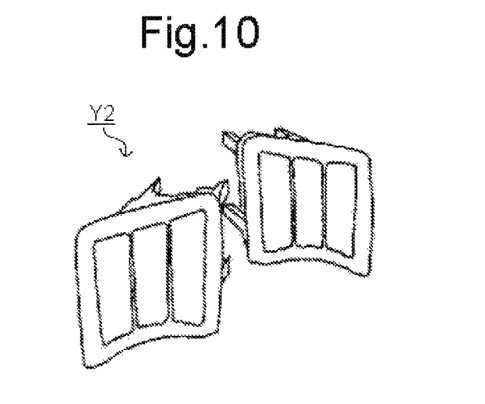
FIG. 10 is an external view of an LED turn lamp module.
Figure 11:
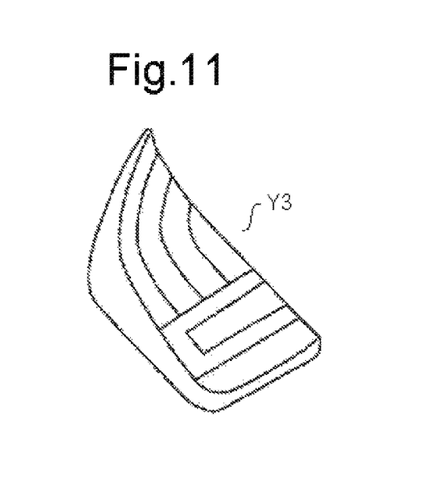
FIG. 11 is an external view LED rear lamp module.

For example, as shown in FIGS. 7 and 8, the LED driver IC 100 can be appropriately used as drive means for a headlight X1 of a vehicle X (appropriately including a high beam, a low beam, a small lamp, a fog lamp, or the like), a day and night running (DRL) light source X2, a tail lamp X3 (appropriately including a small lamp, a back lamp, or the like), a stop lamp X4, a turn lamp X5, and the like. Note that the LED driver IC 100 may be provided as an LED lamp module together with LEDs to be driven (such as an LED headlight module Y1 of FIG. 9, an LED turn lamp module Y2 of FIG. 10, an LED rear lamp module Y3 of FIG. 11, or the like), or may be provided as a single unit of IC independent of the LED.

In addition, the LED driver IC 100 can be appropriately used not only for on-vehicle exterior light but also for applications that need a high-luminance LED light source (such as a head-up display (HUD)).

<Others>

Note that the embodiment described above is merely an example in every aspect and should not be interpreted as a limitation. The technical scope of the present invention is defined not by the above description of the embodiment but by the claims, and should be understood to include all modifications within meanings and scopes equivalent to the claims.

INDUSTRIAL APPLICABILITY

The present invention can be used for an LED driver IC for a vehicle, for example.

LIST OF REFERENCE SIGNS 100, 110 LED driver IC
1 LED
2 PNP transistor
3 resistor
4 capacitor
5 transistor control unit
51 error amplifier

52 switch
6 control logic unit
7 output ground fault protection unit
71 comparator
72 comparator
8 abnormal state output unit
9 PWM signal generation unit
91 capacitor
92 resistor
93 constant current source
94 switch
95 voltage comparing unit
96 inverter
97 MOS transistor
98 inverter
10 reference voltage generation unit
11 constant current source
12 switch
21 first mask signal generation unit
22 second mask signal generation unit

The invention claimed is:

1. A light-emitting element drive device comprising:
a transistor control unit arranged to drive and control a transistor connected to a light-emitting element;
an output ground fault detection unit arranged to output an output ground fault detection signal corresponding to a voltage level at a connection node between the light-emitting element and the transistor;
a stop control unit arranged to stop driving of the transistor when the output ground fault detection signal indicates an output ground fault;
a mask signal generation unit arranged to generate a mask signal that masks the output ground fault detection signal on device startup;
an abnormal state output unit arranged to output an abnormality flag signal indicating an abnormal state when the output ground fault detection signal indicates the output ground fault, wherein the abnormal state output unit outputs the abnormality flag signal indicating a normal state during a period in which the output ground fault detection signal is masked by the mask signal; and
a reference voltage generation unit arranged to generate a reference voltage from a power supply voltage,
wherein:
operation of the output ground fault detection unit starts when the reference voltage rises to reach a predetermined UVLO release voltage on device startup, and
the mask signal generation unit generates the mask signal that rises to a masking level responding to rising of the reference voltage on device startup.

2. An LED light emission device comprising:
an LED as a light-emitting element; and
the light-emitting element drive device according to claim 1, which supplies an output voltage to the LED.

3. The LED light emission device according to claim 2, provided as an LED headlight module, an LED turn lamp module, or an LED rear lamp module.

4. A vehicle comprising the LED light emission device according to claim 2.

* * * * *